United States Patent
Hsieh

(10) Patent No.: US 12,237,351 B2
(45) Date of Patent: *Feb. 25, 2025

(54) SEMICONDUCTOR PACKAGE STRUCTURE AND RELATED METHODS

(71) Applicant: SEMICONDUCTOR COMPONENTS INDUSTRIES, LLC, Phoenix, AZ (US)

(72) Inventor: Yu-Te Hsieh, Taoyuan (TW)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 575 days.

This patent is subject to a terminal disclaimer.

(21) Appl. No.: 17/344,082

(22) Filed: Jun. 10, 2021

(65) Prior Publication Data

US 2021/0305301 A1 Sep. 30, 2021

Related U.S. Application Data

(63) Continuation of application No. 16/177,697, filed on Nov. 1, 2018, now Pat. No. 11,037,970.

(51) Int. Cl.
*H01L 27/146* (2006.01)

(52) U.S. Cl.
CPC .. *H01L 27/14618* (2013.01); *H01L 27/14636* (2013.01); *H01L 27/14683* (2013.01)

(58) Field of Classification Search
CPC ......... H01L 27/14618; H01L 27/14636; H01L 27/14683; H01L 23/498; H01L 23/3128; H01L 21/4846–4867; H01L 21/4807–481
See application file for complete search history.

(56) References Cited

U.S. PATENT DOCUMENTS

| | | | |
|---|---|---|---|
| 6,448,506 | B1 | 9/2002 | Glenn et al. |
| 2008/0191335 | A1 | 8/2008 | Yang et al. |
| 2009/0045478 | A1 | 2/2009 | Hui |
| 2016/0354801 | A1 | 12/2016 | Lundahl |
| 2018/0040786 | A1* | 2/2018 | Chen ..................... H01L 33/505 |
| 2019/0057992 | A1* | 2/2019 | Chen ................ H01L 27/14636 |
| 2019/0074310 | A1 | 3/2019 | Chuang et al. |

* cited by examiner

*Primary Examiner* — Mohammad A Rahman
(74) *Attorney, Agent, or Firm* — IPTechLaw LLC

(57) ABSTRACT

Implementations of semiconductor packages may include: a substrate having a first side and a second side and a die having an active area on a second side of the die. A first side of the die may be coupled to the second side of the substrate. The semiconductor package may also include a glass lid having a first side and a second side. The glass lid may be coupled over a second side of the die. The semiconductor package may include a first and a second molding compound and one or more cushions positioned between a first side of the glass lid and a portion of the first molding compound. The second molding compound may be coupled to the substrate and the around the die and the glass lid.

19 Claims, 3 Drawing Sheets

SEMICONDUCTOR PACKAGE STRUCTURE AND RELATED METHODS

CROSS REFERENCE TO RELATED APPLICATIONS

This application is a continuation application of the earlier U.S. Utility patent application to Hsieh entitled "Semiconductor Package Structure and Related Methods," application Ser. No. 16/177,697, filed Nov. 1, 2018, now pending, the disclosure of which is hereby incorporated entirely herein by reference.

BACKGROUND

1. Technical Field

Aspects of this document relate generally to semiconductor packages, such as image sensors device. Particular implementations may be used in cameras or medical imaging devices.

2. Background

Semiconductor devices may include image sensor die coupled to a substrate through wire bonds. Image sensors convey information related to an image by communicating signals in response to incident electromagnetic radiation. Image sensors are used in a variety of devices including smart phones, digital cameras, night vision devices, medical imagers, and many others. The cavity of image sensors may include plastic sheets or other transparent materials.

SUMMARY

Implementations of semiconductor packages may include: a substrate having a first side and a second side and a die having an active area on a second side of the die. A first side of the die may be coupled to the second side of the substrate. The semiconductor package may also include a glass lid having a first side and a second side. The glass lid may be coupled over a second side of the die. The semiconductor package may include a first and a second molding compound and one or more cushions positioned between a first side of the glass lid and a portion of the first molding compound. The second molding compound may be coupled to the substrate and the around the die and the glass lid.

Implementations of semiconductor package may include one, all, or any of the following:

Wire bonds may electrically couple the die to the substrate.

The die may be an image sensor die.

The substrate may include a stripline or a printed circuit board.

A ball grid array may be on a first side of the substrate.

The one or more cushions may include epoxy, silicone, acrylic, resin, polyimide, polymer, or any combination thereof.

Implementations of semiconductor packages may include: a substrate having a first side and a second side and a die having an active area on a second side of the die. A first side of the die may be coupled to the second side of the substrate. The package may include a first side and a second side and the glass lid may be coupled over a second side of the die. The package may include a first molding compound coupled to the substrate and around a portion of the die. The first molding compound may include one or more shelves on either side of the die. The package may include a dam positioned on each of the one or more shelves and a glass lid coupled to the dam. A second molding compound may be coupled with an edge of the first molding. The second molding compound may be coupled over a portion of the second side of the glass lid.

Implementations of semiconductor packages may include one, all, or any of the following:

Wire bonds may electrically couple the die to the substrate.

The die may be an image sensor.

The substrate may be a stripline or a printed circuit board.

A ball grid array may be coupled to a first side of the substrate.

The dam may be selected from a group consisting of epoxy, silicone, acrylic, resin, polyimide, polymer, or any combination thereof.

Implementations of a method of forming semiconductor packages may include: coupling a first side of a die to a second side of a substrate and applying a first molding compound to the second side of the substrate and a portion of the first side of the die. The molding compound may include a shelf above a second side of the die. The method may include applying a cushion to the shelf and coupling a first side of the glass lid to the shelf. The method may include forming a second molding compound on an interface of the first molding compound. The second molding compound may be coupled around two or more sides of the glass lid and a portion of a second side of the glass lid.

Implementations of a method of forming semiconductor packages may include one, all, or any of the following:

The method may further include curing the cushion to form a dam and curing may include environmental, thermal, or ultraviolet curing.

The cushion may include epoxy, silicone, acrylic, resin, polyimide, or any combination thereof.

The die may be an image sensor having an active area on the second side of the die.

The substrate may include a stripline or a printed circuit board.

The method may further include plasma cleaning the interface of the first molding compound.

The method may further include electrically coupling the die to the substrate through wire bonds.

The method may further include applying a ball grid array to a first side of the substrate.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
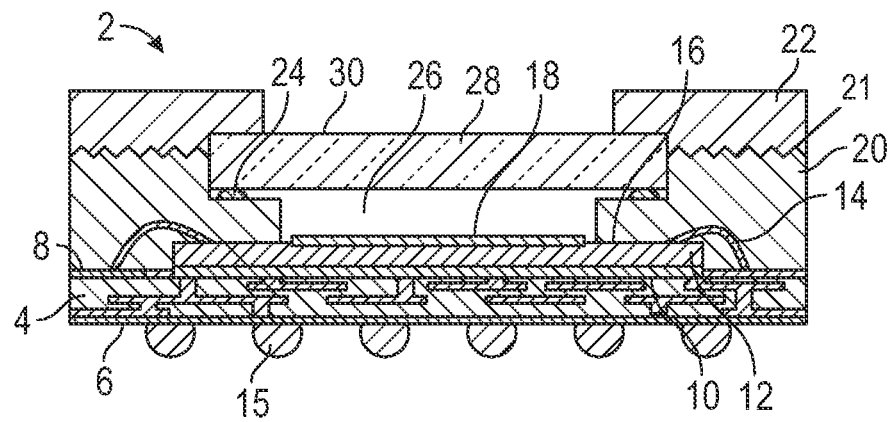
FIG. 1 is a cross sectional view of an implementation of a semiconductor package.

Referring to FIG. 1, an implementation of a semiconductor package 2 is illustrated. The package includes a substrate 4 having a first side 6 and a second side 8. In various implementations, the substrate may be a stripline. In some implementations, the stripline substrate may have multiple units on it. In other implementations, the substrate may be a printed circuit board or other similar substrates. The package also includes a first side 10 of a die 12 coupled to the second side 8 of the substrate 4 through wire bonds 14. In some implementations, the wire bonds may be gold wire. In various implementations, the die 12 is coupled to the substrate 4 through die bond adhesive such as, by non-limiting example, epoxies or polyimides. The die bond adhesive may be electrically conductive in various implementations, or may not be electrically conductive.

In implementations including a silicon die, the silicon substrate may include a photodiode array therein. In various implementations, the semiconductor die 12 includes a silicon layer. In other implementations, the semiconductor die 12 may include a substrate having silicon dioxide, glass, silicon-on-insulator, gallium arsenide, sapphire, ruby, silicon carbide, polycrystalline or amorphous forms of any of the foregoing, and any other type of substrate type for constructing image sensor or semiconductor devices.

The second side 16 of the die 12 includes an active area 18. In various implementations, the die may be a contact image sensor (CIS) die. In an image sensor die, the active area 18 includes a contact layer. In various implementations, the contact layer may be considered part of the semiconductor die, or it may be considered separate from but coupled to the semiconductor die. As used herein, the contact layer is considered part of the semiconductor die and is not considered separate from the material of the semiconductor die. In various implementations, the contact layer may be an interlayer dielectric (LID) material. The contact layer may also include one or more metal layers therein. The metal layers may include one or more metal landing pads. In various implementations, the metal layers and/or metal landing pads may include aluminum, copper, tungsten, any other metal, and any combination or alloy thereof. In various implementations, the contact layer may include one or more diffusion barrier layers. In particular implementations, the one or more diffusion barrier layers may be adjacent to the backside/first surface, and/or the front side/second surface. The diffusion barrier layer may include SiN or any other material used in a diffusion barrier layer. The contact layer may include other elements therein, such as gates or other semiconductor elements.

A ball grid array 15 is coupled to a first side 6 of the substrate 4. The ball grid array 15 may be formed of solder, gold, copper, nickel, lead, tin, or other suitable electrically conductive materials. In various implementations, other types of interconnects may be coupled to the first side of the substrate such as, by non-limiting example, pin grid array (PGA), land grid array, individual solder balls, gold studs, copper studs, and other interconnects that have good electrical conductive properties.

The package also includes two portions of molding compound 20, 22. An interface 21 is illustrated between the first molding compound and the second molding compound. The interface is illustrated in an enlarged form for ease of viewing and explanation, in actual devices the interface may not be readily visible. In some implementations, the interface may be roughened or patterned to aid in bonding of the first molding compound and the second molding compound. The two portions of molding compound may help to seal the glass. The first portion 20 of molding compound is formed on and over a portion of the substrate 4 and the die 12. In various implementations, the molding compounds may include, by non-limiting example, epoxies, polymers, resins, or other mold compound types.

Figure 8:
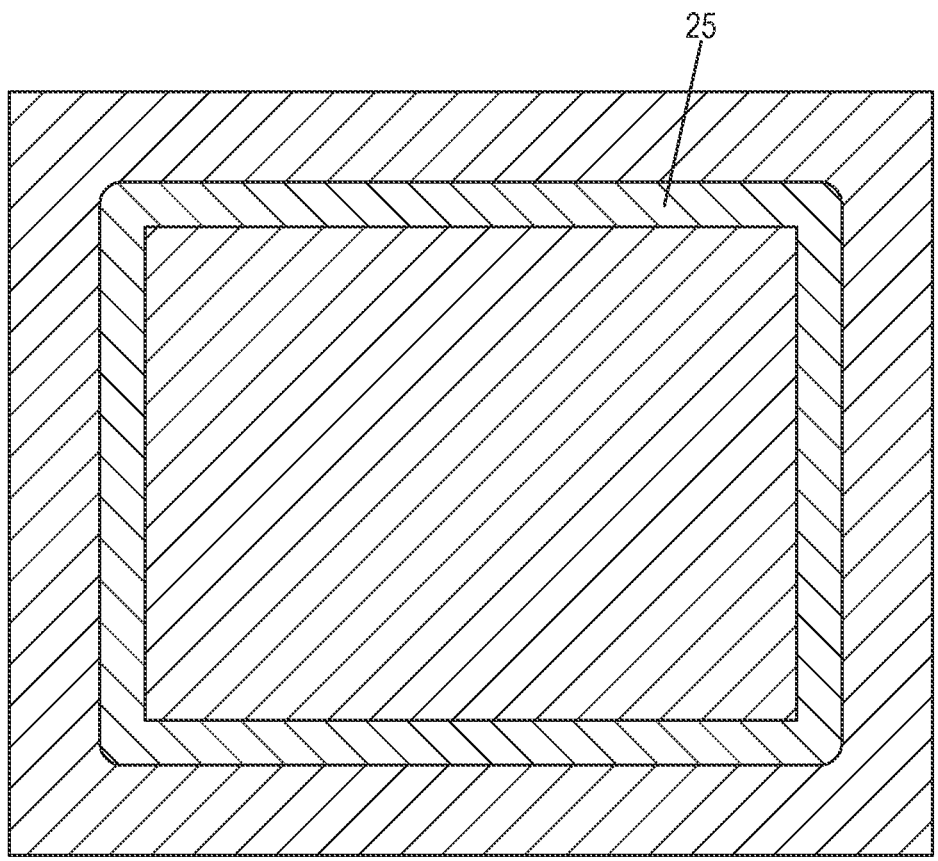
FIG. 8 is top view of an implementation of a cushion in a closed loop having a substantially rectangular shape in an implementation of semiconductor device.

From the cross sectional view, the cushion 24 is illustrated as two cushions positioned between a first side 26 of a glass lid 28 and the first portion 20 of the molding compound. In a top view as illustrated in FIG. 8, the cushion 25 is illustrated as a closed loop having a substantially rectangular shape. The cushion may be dispensed on the shelf of the first molding compound to support the lid and adhere to the glass. In some implementations, two cushions could be formed where the two cushions are concentric. In other implementations, more than two cushions may be used. In various implementations, the cushion may be positioned between the glass lid and the first portion of molding compound. The cushion may allow the release of thermal stress and improve reliability of the package. The cushions may also be referred to as dams. The dams may further increase the air and moisture seal of the die. The cushions/dams may be formed of, by non-limiting example, rubber, resin, epoxy, silicone, acrylic, polyimide, polymer, any combination thereof, or other resilient and moisture blocking materials. The second portion 22 of molding compound is coupled with an edge of the first portion of molding compound and over a portion of a second side 30 of the glass lid. Using a combination of molding compounds may decrease chances of delamination when compared with packages employing an adhesive to hold the glass lid over the die. Typical packaging for CIS use liquid adhesive to bond the glass lid on CIS die. Typical packages suffer from delamination on the interface between resin and glass or between resin and die when the thermal stress increases.

Figure 2:
FIG. 2 is a cross sectional view of an implementation of a substrate.

Referring to FIGS. 2-7, an implementation of a method of forming a semiconductor package is illustrated. The method includes providing a substrate 32 as illustrated in FIG. 2. The substrate may include a stripline structure. A stripline circuit uses a flat strip of metal coupled between two parallel group planes. The insulating material of the substrate forms a dielectric. In various implementations, the stripline may include multiple units on a single strip. In some implementations, the multiple units may be singulated before coupling die to the substrates. In other implementations, the multiple units may be singulated later in the process. In other implementations, the substrate may be a standard printed circuit board, laminated substrate, sintered substrate, or another substrate type.

Figure 3:
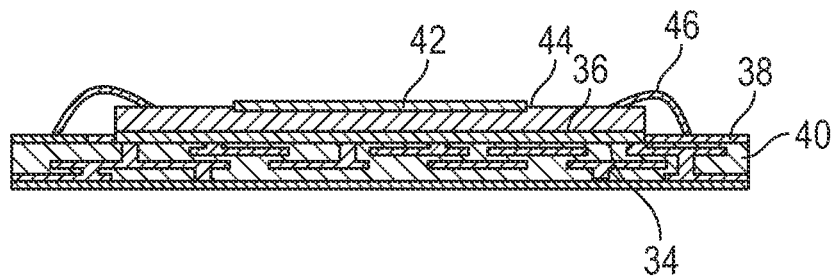
FIG. 3 is a cross sectional view of an implementation of a die coupled to a substrate.

Referring to FIG. 3, the method includes coupling a first side 34 of a semiconductor die 36 to the second side 38 of the substrate 40. The first side of the die 34 may be coupled through die adhesive such as epoxies or polyimides. In various implementations, the die may be made of silicon. In other implementations, the semiconductor die may include a substrate having silicon dioxide, glass, silicon-on-insulator, gallium arsenide, sapphire, ruby, silicon carbide, polycrystalline or amorphous forms of any of the foregoing, and any other type of substrate for constructing image sensor or semiconductor devices. The die 36 includes an active region 42 on the second side 44 of the die. The active region of the die may be a contact image sensor (CIS). In various implementations, the contact layer may be considered part of the semiconductor die, or it may be considered separate from but coupled to the semiconductor die. The die is electrically coupled to the substrate through two or more wire bonds 42. In various implementations, the wire bonds may be gold wire or another suitable metal.

The die may be formed through various methods of processing semiconductor die after forming a plurality of semiconductor devices thereon. The die may each be separated by die streets in various implementations. The method may include thinning a backside of the die opposite the first side of the die. This may be done by thinning the wafer using any suitable method such as by non-limiting example, backgrinding, lapping, wet etching, any combination thereof, or any other technique for removing backside damage and/or the material of the semiconductor substrate substantially uniformly across the largest planar surface of the substrate. The method may also include flipping the wafer. The wafer may be coupled to a backgrinding tape and flipped using the tape. In other implementations, the wafer may be singulated into individual die and then the die may be flipped. The plurality of die may be singulated through lasering, sawing, plasma etching, or water jet ablating. Following singulation, the individual die may be coupled to a picking tape thereby making flipping easier. In other implementations, the die may be individually removed from the picking tape through a pick and place system and sorted into a carrier tape.

The die is then removed from the carrier tape and coupled with the substrate using any of the die attach materials disclosed in this document. Wire bonds are then applied to the die and substrate to make the needed electrical connections between the die and the substrate. However, in various implementations, electrical connectors other than wire bonds could be employed such as, by non-limiting example, bumps, pillars, through silicon vias, pads, clips, or other electrical connector types.

Figure 4:
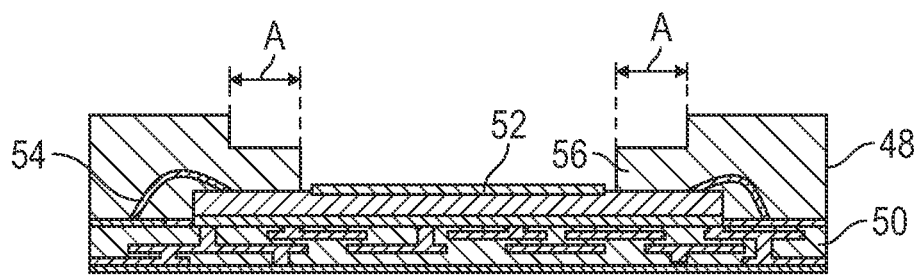
FIG. 4 is a cross sectional view of an implementation of a first portion of mold compound formed around a die.
Figure 6:
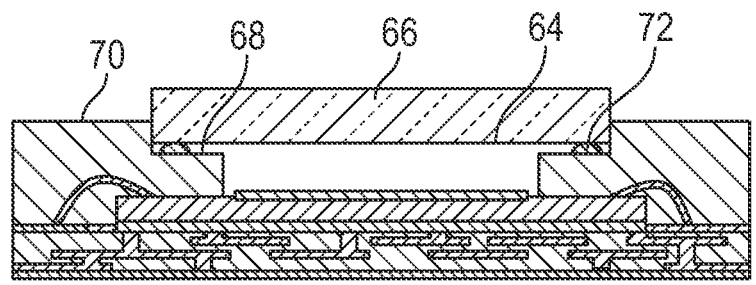
FIG. 6 is a cross sectional view of an implementation of a glass lid coupled over a die.
Figure 7:
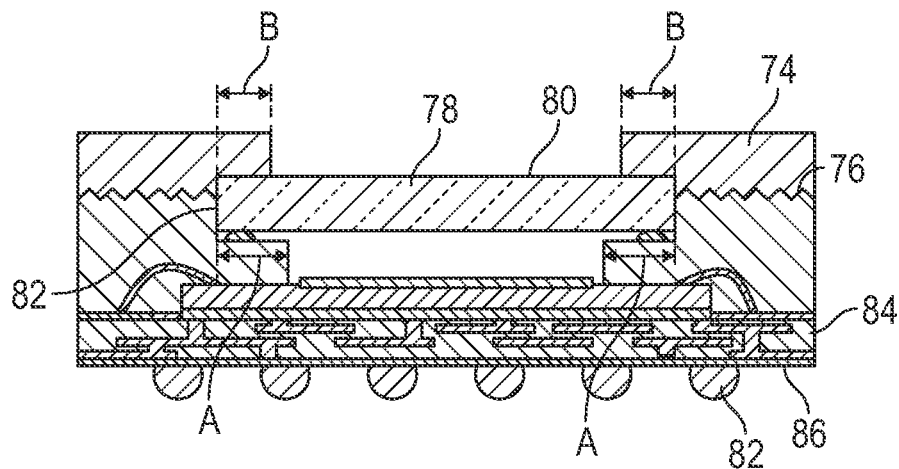
FIG. 7 is a cross sectional view of an implementation of a semiconductor package having a second portion of mold compound coupled with a first portion of mold compound.

Referring to FIG. 4, the method then includes forming a first portion 48 of molding compound over the substrate 50 and the die 52. The first 48 molding compound may be formed to couple over a portion of the substrate 50 and around a portion of the die 52. The first 48 molding compound does not contact the active area of the die. In various implementations, the first 48 molding compound may be formed to protect and encapsulate the wire bonds 54 coupling the die 52 to the substrate 50. The first portion of molding compound may form a shelf 56. The shelf 56 may form a platform for the glass lid to attach to as illustrated in FIG. 6. The shelf may have a width A, which may be wider than width B of the second molding compound as illustrated in FIG. 7. The differences in width of molding compound may facilitate formation of the second molding compound. The differences in width may also prevent cracking of a glass lid during pressure loading during the molding process. In various implementations, the first molding compound may be formed through transfer molding. In other implementations, the molding compound may be formed through other suitable molding processes.

Figure 5:
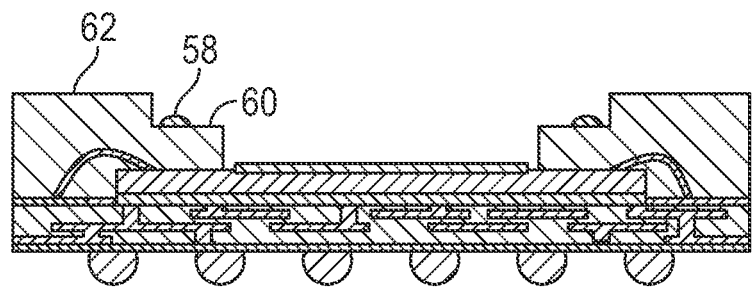
FIG. 5 is a cross sectional view of an implementation of cushions on a shelf of a first portion of mold compound.

Referring to FIG. 5, the method also includes applying a flexible cushion/dam 58 to the shelf formed in the first molding compound 62. The flexible cushion/dam 58 may be made of, by non-limiting example, rubber, epoxy, silicone, acrylic, resin, polyimide, polymer, any materials described herein, or any combination thereof. The flexible cushion/dam 58 may act as a buffer to thermal stress and prevent the delamination of the package. In various implementations, the modulus of the flexible dam may be very low in order to allow the coefficient of thermal expansion (CTE) to be variable.

Referring to FIG. 6, the method further includes coupling a first side 64 of a glass lid 66 to the shelf 68 of the first molding compound. The glass lid 66 is coupled to the shelf 68 through/over the flexible cushion/dam 72. The flexible property of cushion/dam 72 may also allow for changes in the gap height between the glass lid and the sensor in the active area of the die. The flexibility of the cushion/dam 72 may also help to keep the glass lid 66 in a planar position. In some implementations, the material of the flexible cushion 72 may be cured following placement of the lid over the cushion 72. The flexible cushion may be cured by ambient environmental (activated by moisture) cure, thermal cure, or by ultraviolet light cure. In various implementations, the flexible cushion may have high stand off capability and may become a dam after having been cured.

Referring to FIG. 7, the method may include forming a second molding compound 74 on an interface of the first molding compound 76 and a portion of the second side 78 of the glass lid 80. As previously described, the interface between the first molding compound and the second molding compound is exaggerated in FIG. 7 to facilitate understanding of this feature. The second molding compound is also coupled around two or more edges 82 of the glass lid. The second molding compound may create a seal around the glass lid. In various implementations, the method may further include plasma cleaning the interface of the first molding compound before coupling of the second molding compound. Plasma cleaning may help form a stronger adhesive bond between the first molding compound and the second molding compound.

As previously described, the width of the shelf A may be larger than the width B of the second molding compound 74 covering a second side 78 of the glass lid 80. The differences in width may also decrease problems in the manufacturing process. As previously mentioned, differences in width may prevent cracking of the glass lid during pressure loading of the molding process. The second molding compound has a flat surface on the side of the second molding compound opposing the first molding compound. In various implementations, the flat surface may be suitable to couple a lens holder to the second molding compound. The structure of the semiconductor packages like those disclosed in this document may provide a more flexible and compact size for a camera module design.

The method of forming a semiconductor package also includes coupling a ball grid array 82 to the first side 86 of the substrate 84. In various implementations, other interconnects may be coupled to the first side of the substrate such as by non-limiting example land grid array (LGA), pin grid array (PGA), or individual interconnects. The interconnects may be coupled through soldering. In other implementations, the array of interconnects may be coupled through sockets. Individual interconnects may include bumps, studs, or pins formed of electrically conductive metals such as, by non-limiting example, gold, copper, silver, lead, tin, nickel or any combination thereof.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
   a substrate;
   a die coupled to the substrate;
   a glass lid coupled over the die, the glass lid comprising an inner surface facing the die, an outer surface opposite the inner surface, and a sidewall between the inner surface and the outer surface; and
   a first molding compound and a second molding compound forming an interface around the glass lid;
   wherein the first molding compound and the second molding compound are directly coupled to the sidewall of the glass lid.

2. The package of claim 1, further comprising wire bonds electrically coupling the die to the substrate, wherein the wire bonds are encapsulated within the first molding compound.

3. The package of claim 1, wherein the die comprises an active area facing the glass lid.

4. The package of claim 1, wherein the substrate is one of a stripline or a printed circuit board.

5. The package of claim 1, further comprising a ball grid array on a first side of the substrate.

6. The package of claim 1, further comprising one or more cushions coupled between the glass lid and the first molding compound.

7. A semiconductor package comprising:
   a die coupled to a substrate;
   a glass lid coupled over the die;
   a first molding compound coupled to the substrate and around a portion of the die, the first molding compound comprising one or more shelves; and
   a second molding compound coupled with an edge of the first molding compound, the second molding compound coupled over an outer surface of the glass lid opposite an inner surface of the glass lid facing the die;
   wherein the glass lid is positioned on the one or more shelves;
   wherein the die is an image sensor die.

8. The package of claim 7, further comprising a gap between the image sensor die and the glass lid.

9. The package of claim 7, wherein the substrate is one of a stripline or a printed circuit board.

10. The package of claim 7, further comprising a dam positioned on the one or more shelves between the one or more shelves and the glass lid.

11. A semiconductor package comprising:
    a substrate;
    a die coupled to the substrate;
    a glass lid coupled over the die; and
    a first molding compound coupled to the substrate, the first molding compound comprising one or more shelves; and
    a second molding compound coupled to the first molding compound;
    wherein the glass lid is positioned on the one or more shelves;
    wherein the glass lid is coupled within a recess of the first molding compound; and
    wherein both the first molding compound and the second molding compound are directly coupled to a same sidewall of the glass lid.

12. The package of claim 11, further comprising wire bonds electrically coupling the die to the substrate, wherein the wire bonds are encapsulated within the first molding compound.

13. The package of claim 11, wherein the die is an image sensor die.

14. The package of claim 11, wherein the substrate is one of a stripline or a printed circuit board.

15. The package of claim 11, further comprising one or more cushions coupled between the glass lid and the first molding compound.

16. The package of claim 11, wherein the first molding compound and the second molding compound form an interface directly coupled to a sidewall of the glass lid.

17. A semiconductor package comprising:
    a substrate;
    a die coupled to the substrate;
    a glass lid coupled over the die; and
    a first molding compound and a second molding compound forming an interface around the glass lid;
    wire bonds electrically coupling the die to the substrate;
    wherein the wire bonds are encapsulated within the first molding compound;
    wherein the interface is directly coupled to a sidewall of the glass lid.

18. The package of claim 17, wherein the die is an image sensor die comprising a plurality of pixels.

19. The package of claim 18, further comprising a gap between the image sensor die and the glass lid.

* * * * *